United States Patent
Park et al.

(10) Patent No.: US 10,691,018 B2
(45) Date of Patent: Jun. 23, 2020

(54) PHOTORESIST COMPOSITION AND A METHOD FOR FORMING A FINE PATTERN USING THE SAME

(71) Applicant: SAMSUNG ELECTRONICS CO., LTD., Suwon-si, Gyeonggi-do (KR)

(72) Inventors: Jin Park, Yongin-si (KR); Hyunwoo Kim, Hanam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 15/702,839

(22) Filed: Sep. 13, 2017

(65) Prior Publication Data

US 2018/0164682 A1 Jun. 14, 2018

(30) Foreign Application Priority Data

Dec. 8, 2016 (KR) .................. 10-2016-0166911
Aug. 9, 2017 (KR) .................. 10-2017-0101279

(51) Int. Cl.
G03F 7/004 (2006.01)
G03F 7/038 (2006.01)
(Continued)

(52) U.S. Cl.
CPC .............. *G03F 7/038* (2013.01); *C08F 12/24* (2013.01); *C08F 20/18* (2013.01); *C08F 112/14* (2013.01);
(Continued)

(58) Field of Classification Search
CPC ...... G03F 7/004; G03F 7/0045; G03F 7/0046; G03F 7/038; G03F 7/0382; G03F 7/16;
(Continued)

(56) References Cited

U.S. PATENT DOCUMENTS 5,998,092 A 12/1999 McCulloch et al.
6,872,502 B2 3/2005 Lee
(Continued)

FOREIGN PATENT DOCUMENTS

JP 2008268484 A * 11/2008
JP 5623896 B2 11/2014
(Continued)

OTHER PUBLICATIONS

Machine translation of JP 2008-268484 (no date).*

*Primary Examiner* — Amanda C. Walke
(74) *Attorney, Agent, or Firm* — Lee IP Law, PC

(57) ABSTRACT

A photoresist composition includes a photosensitive polymer including a polymer chain and at least one first functional group coupled to the polymer chain, and a photoacid generator. The first functional group has a structure represented by the following Chemical Formula 1, $$-R_1-\underset{\underset{R_2}{|}}{\overset{\overset{OH}{|}}{C}}-OH$$

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20.

4 Claims, 4 Drawing Sheets

(51) Int. Cl.
*G03F 7/16* (2006.01)
*H01L 21/027* (2006.01)
*G03F 7/26* (2006.01)
*C08F 112/14* (2006.01)
*C08F 120/28* (2006.01)
*G03F 7/20* (2006.01)
*C08F 12/24* (2006.01)
*C09D 125/18* (2006.01)
*C08F 20/18* (2006.01)

(52) U.S. Cl.
CPC .......... *C08F 120/28* (2013.01); *C09D 125/18* (2013.01); *G03F 7/0045* (2013.01); *G03F 7/0046* (2013.01); *G03F 7/0382* (2013.01); *G03F 7/16* (2013.01); *G03F 7/2002* (2013.01); *G03F 7/26* (2013.01); *H01L 21/0274* (2013.01)

(58) Field of Classification Search
CPC ..... G03F 7/2002; G03F 7/26; H01L 21/0274; C08F 12/24; C08F 20/18; C08F 20/24; C08F 112/14
USPC ...................................... 430/270.1
See application file for complete search history.

(56) References Cited

U.S. PATENT DOCUMENTS

| | | | |
|---|---|---|---|
| 7,326,518 | B2 | 2/2008 | Cameron et al. |
| 8,440,386 | B2 | 5/2013 | Hatakeyama et al. |
| 8,623,590 | B2 | 1/2014 | Hatakeyama et al. |
| 8,628,911 | B2 | 1/2014 | Bae et al. |
| 8,795,943 | B2 | 8/2014 | Park et al. |
| 9,335,632 | B2 * | 5/2016 | Hatakeyama ........... G03F 7/039 |
| 9,448,482 | B2 * | 9/2016 | Iwato ................ G03F 7/40 |
| 9,523,914 | B2 * | 12/2016 | Hatakeyama ......... G03F 7/2004 |
| 9,527,809 | B2 * | 12/2016 | Yokokawa .............. G03F 7/039 |
| 9,551,931 | B2 * | 1/2017 | Ito ........................... G03F 7/038 |
| 9,772,555 | B2 * | 9/2017 | Park ..................... H01L 21/0276 |
| 10,012,902 | B2 * | 7/2018 | Hatakeyama ............. G03F 7/38 |
| 10,173,975 | B2 * | 1/2019 | Ohashi .................. C08F 220/24 |
| 2015/0370168 | A1 | 12/2015 | Wang et al. |

FOREIGN PATENT DOCUMENTS

| | | | |
|---|---|---|---|
| JP | 5647804 | B2 | 1/2015 |
| JP | 2016110051 | A * | 6/2016 |
| KR | 10-2003-0035005 | A | 5/2003 |

* cited by examiner

US 10,691,018 B2

PHOTORESIST COMPOSITION AND A METHOD FOR FORMING A FINE PATTERN USING THE SAME

CROSS-REFERENCE TO RELATED APPLICATION

Korean Patent Application Nos. 10-2016-0166911 and 10-2017-0101279, respectively filed on Dec. 8, 2016, and on Aug. 9, 2017, in the Korean Intellectual Property Office, and entitled: Photoresist Composition and a Method for Forming a Fine Pattern Using the Same, is incorporated by reference herein in its entirety.

BACKGROUND

1. Field

Embodiments relate to a chemically amplified photoresist composition and a method for forming a fine pattern of a semiconductor device by using the same.

2. Description of the Related Art

Fine patterns are desirable to manufacture a highly integrated semiconductor device. To integrate many elements in a small area, it is desirable that each individual element should be formed to be as small as possible.

SUMMARY

Embodiments are directed to a photoresist composition including a photosensitive polymer including a polymer chain and at least one first functional group coupled to the polymer chain, and a photoacid generator. The first functional group has a structure represented by the following Chemical Formula 1 or the following Chemical Formula 1-1,

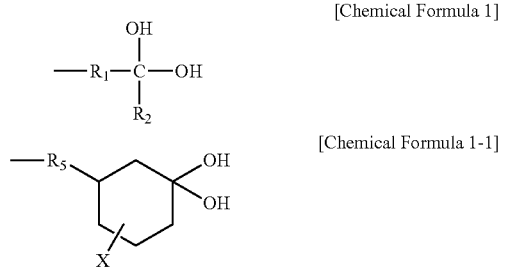

[Chemical Formula 1]

[Chemical Formula 1-1]

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20. $R_5$ is one of an alkyl group having a carbon number of 1 to 20 and an aryl group having a carbon number of 1 to 20, and X is one of —H, —F, —Cl, —Br, —I, —$NH_2$, —OH, and halide.

Embodiments are also directed to a method for forming a fine pattern, the method including applying a photoresist composition to a substrate to form a photoresist layer on the substrate, performing an exposure process on the substrate to expose a portion of the photoresist layer, and performing a development process on the substrate to pattern the photoresist layer. The photoresist composition may include a photosensitive polymer including a polymer chain and at least one first functional group coupled to the polymer chain, and a photoacid generator. The first functional group may have a structure represented by the following Chemical Formula 1 or the following Chemical Formula 1-1,

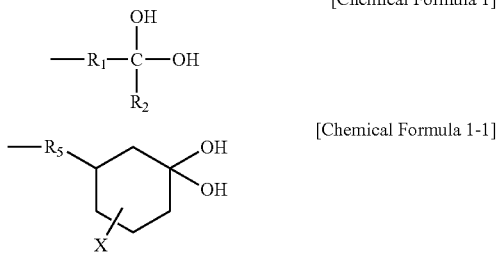

[Chemical Formula 1]

[Chemical Formula 1-1]

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20. $R_5$ is one of an alkyl group having a carbon number of 1 to 20 and an aryl group having a carbon number of 1 to 20, and X is one of —H, —F, —Cl, —Br, —I, —$NH_2$, —OH, and halide.

Embodiments are also directed to a photoresist composition, including a polymer including a polymer chain and a first functional group coupled to the polymer chain, and a photoacid generator. The photoacid generator generates acid ions ($H^+$) when the photoacid generator is exposed to light. The first functional group is convertible into a second functional group by a de-protection reaction using the acid ions ($H^+$) as a catalyst. The second functional group has a structure represented by the following Chemical Formula 8 or the following Chemical Formula 11,

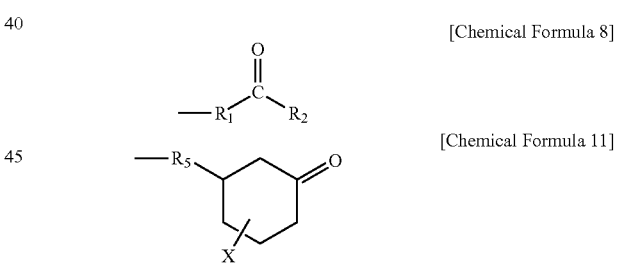

[Chemical Formula 8]

[Chemical Formula 11]

where $R_1$ is one of an alkyl group having a carbon number of 1 to 20 and an aryl group having a carbon number of 1 to 20, $R_2$ is one of —H, —F, —Cl, —Br, an alkyl group having a carbon number of 1 to 20, and an aryl group having a carbon number of 1 to 20, $R_5$ is one of an alkyl group having a carbon number of 1 to 20 and an aryl group having a carbon number of 1 to 20, and X is one of —H, —F, —Cl, —Br, —I, —$NH_2$, —OH, and halide, and wherein the polymer is hydrophilic when it contains the first functional group and hydrophobic when the first functional group is converted into the second functional group.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
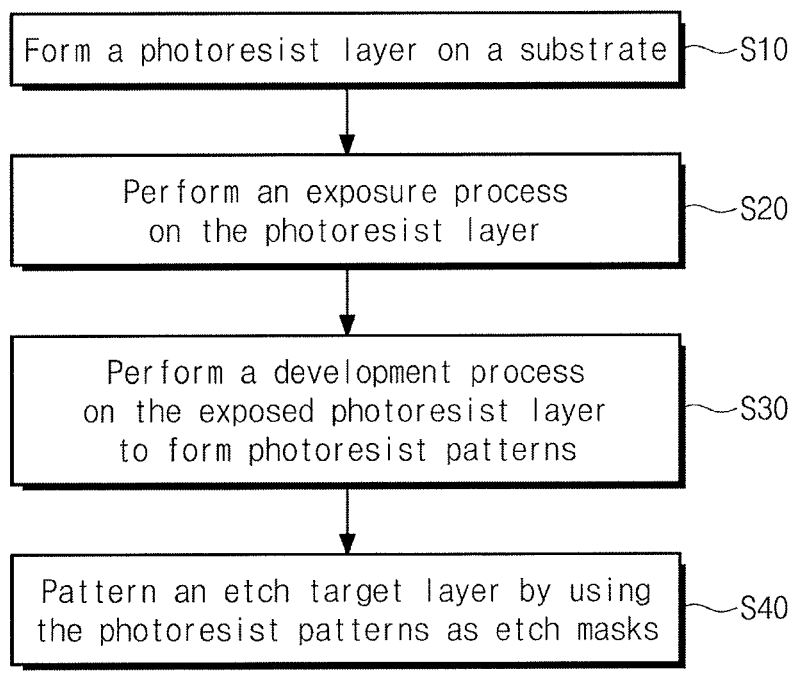
FIG. 1 illustrates a flow chart depicting a method for forming a fine pattern, according to embodiments.

According to embodiments, a photoresist composition may be a chemically amplified negative photoresist composition that includes a photosensitive polymer and a photoacid generator (PAG). The photosensitive polymer may include a polymer chain with at least one first functional group coupled to the polymer chain. The polymer chain may be a polystyrene backbone chain or a methacrylate backbone chain. The first functional group may have a structure represented by the following Chemical Formula 1 or the following Chemical Formula 1-1.

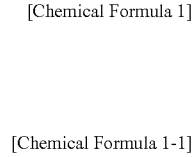

[Chemical Formula 1]

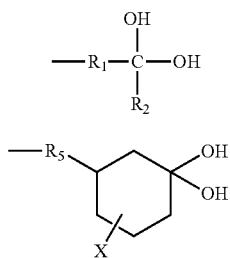

[Chemical Formula 1-1]

Here, $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20. $R_5$ is one of an alkyl group having a carbon number of 1 to 20 and an aryl group having a carbon number of 1 to 20, and X is one of —H, —F, —Cl, —Br, —I, —NH$_2$, —OH, and halide.

In some embodiments, the photosensitive polymer may include a structure represented by the following Chemical Formula 2 or the following Chemical Formula 3.

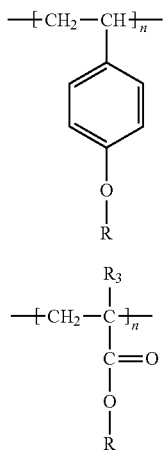

[Chemical Formula 2]

[Chemical Formula 3]

In Chemical Formulas 2 and 3, n is an integral number ranging from 1 to 1,000,000. $R_3$ is one of —H and —CH$_3$. R is represented by Chemical Formula 1 or Chemical Formula 1-1, or is represented by one of the following Chemical Formula 4 and the following Chemical Formula 5.

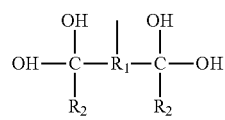

[Chemical Formula 4]

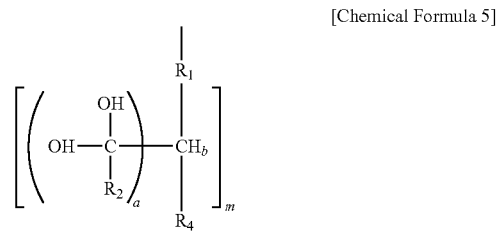

[Chemical Formula 5]

Here, a sum of a and b is 2 (i.e., a+b=2), where a is 1 or 2, b is 0 or 1, and m ranges from 1 to 20. $R_1$ and $R_2$ are the same as defined in Chemical Formula 1, and $R_4$ is one of an alkyl group having a carbon number of 1 to 20 and an aryl group having a carbon number of 1 to 20.

The photoacid generator may generate acid ions (H$^+$) when the photoacid generator is exposed to light. For example, the photoacid generator may include a triarylsulfonium salt, a diaryliodonium salt, a sulfonate, or a mixture thereof.

When the photoresist composition is exposed to light, acid ions (H$^+$) generated by the photoacid generator may be included in the photoresist composition. The first functional group in the photosensitive polymer may be converted into a second functional group (for example, a ketone group (when $R_2$ is an alkyl group or an aryl group), an aldehyde group (when $R_2$ is H), or an acid halide (when $R_2$ is —F, —Cl, —Br)), by a de-protection reaction using acid ions (H$^+$) as a catalyst, as represented by the following Reaction Formula 1 or the following Reaction Formula 1-1.

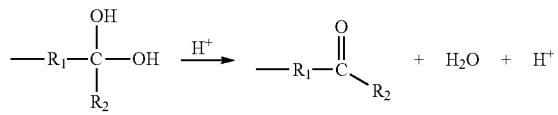

[Reaction Formula 1]

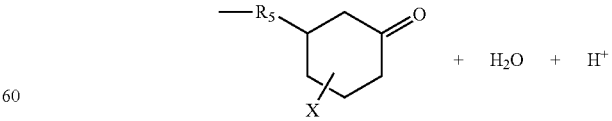

[Reaction Formula 1-1]

Thus, the photoresist composition may include a photosensitive polymer modified by exposure to light. The modified photosensitive polymer may include the polymer chain and at least one second functional group (for example, at least one of a ketone group, aldehyde group, or acid halide)

coupled to the polymer chain. In some embodiments, the modified photosensitive polymer may include a structure represented by the following Chemical Formula 6 or the following Chemical Formula 7.

[Chemical Formula 6]

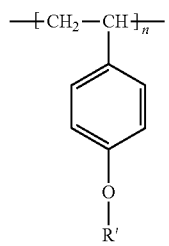

[Chemical Formula 7]

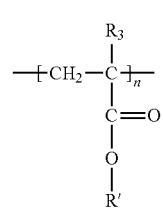

In Chemical Formulas 6 and 7, n and $R_3$ are the same as defined in Chemical Formulas 2 and 3. R' is represented by one of the following Chemical Formula 8, Chemical Formula 9, Chemical Formula 10, and Chemical Formula 11. R' corresponds to the second functional group (for example, the ketone group, aldehyde group, or acid halide group).

[Chemical Formula 8]

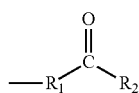

Here, $R_1$ and $R_2$ are the same as defined in Chemical Formula 1.

[Chemical Formula 9]

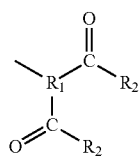

Here, $R_1$ and $R_2$ are the same as defined in Chemical Formula 1.

[Chemical Formula 10]

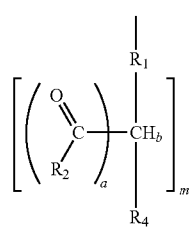

[Chemical Formula 11]

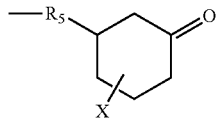

Here, $R_1$ and $R_2$ are the same as defined in Chemical Formula 1, and a, b, m, and $R_4$ are the same as defined in Chemical Formula 5. $R_5$ and X are the same as defined in Chemical Formula 1-1.

The photosensitive polymer, before the photoresist composition is exposed to the light, may have a hydrophilic property. The modified photosensitive polymer, after the photoresist composition is exposed to the light, may have a hydrophobic property. A solubility of the modified photosensitive polymer may be different from a solubility of the photosensitive polymer due to a difference in solubility between the second functional group (for example, the ketone group, aldehyde group, or acid halide group), and the first functional group (for example, the geminal diol group).

Generally, a chemically amplified negative photoresist composition may include a photosensitive polymer having a hydrophilic property. In a case in which the chemically amplified negative photoresist composition is exposed to light, the photosensitive polymer may react with a crosslinking agent in the presence of an acid ion ($H^+$) catalyst generated by the exposure. The photosensitive polymer may be converted into a photosensitive polymer having a hydrophobic property. In this case, the crosslinking reaction of the photosensitive polymer and the crosslinking agent may be performed by a first reaction between a first polymer in the photosensitive polymer and the crosslinking agent, and a second reaction between a second polymer in the photosensitive polymer and the crosslinking agent. Since the crosslinking reaction is performed through a plurality of reaction steps, a reaction rate of the crosslinking reaction may be relatively low. Thus, a photosensitivity of the chemically amplified negative photoresist composition may be low.

According to embodiments, the photosensitive polymer of the photoresist composition may include at least one first functional group coupled to the polymer chain. When the photoresist composition is exposed to light, the first functional group may be converted into a second functional group by a de-protection reaction in the presence of the acid ion ($H^+$) catalyst generated by the exposure without an additional crosslinking reaction. In this case, a reaction path of the de-protection reaction may be simpler than a crosslinking reaction caused by a crosslinking agent. Accordingly, a reaction rate of the de-protection reaction may be relatively high. Thus, the photosensitivity of the photoresist composition may be high. In addition, due to the difference in solubility between the first functional group and the second functional group, a pattern may be easily formed using the photoresist composition.

The following Example is provided in order to highlight characteristics of one or more embodiments, but it is to be understood that the Example is not to be construed as limiting the scope of the embodiments.

Synthesis Example 1 of the First Functional Group

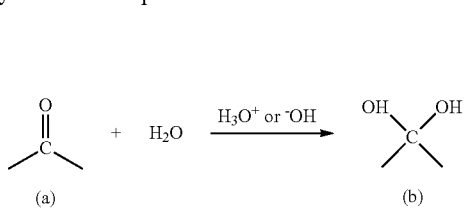

H$_2$O is added into a starting material (a), and the starting material (a) is reacted in the presence of an acid or base catalyst to manufacture a product (b) having the first functional group.

Synthesis Example 2 of the First Functional Group

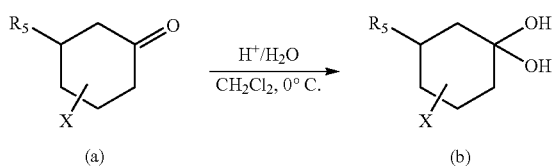

Here, R$_5$ is one of an alkyl group having a carbon number of 1 to 20 and an aryl group having a carbon number of 1 to 20. X is one of —H, —F, —Cl, —Br, —I, —NH$_2$, —OH, and halide.

A starting material (a) is dissolved in di-chloro-methane (DCM) at a room temperature. H$_2$O is added into a solution including the starting material (a) and the DCM solvent. In this case, 3 equivalents of H$_2$O are added per 1 equivalent of the starting material (a). Thereafter, a temperature of the solution is lowered to 0 degrees Celsius, and acid ions (H$^+$) are added into the solution. At this time, 1.2 equivalents of the acid ions (H$^+$) are added per 1 equivalent of the starting material (a). The solution (reactant) in which H$_2$O and the acid ions (H$^+$) are added is stirred at 0 degrees Celsius for 30 minutes to manufacture a product (b) having the first functional group.

Synthesis Example 1 of the Photosensitive Polymer

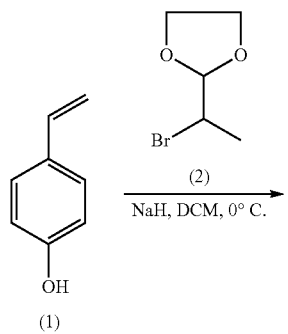

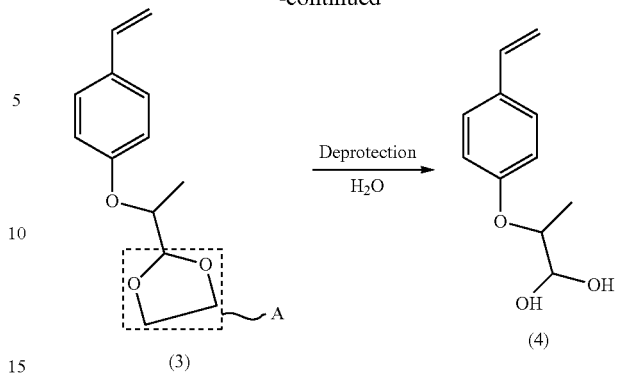

A starting material (1) is dissolved in di-chloro-methane (DCM) at a room temperature under an Ar gas atmosphere. The temperature is lowered to 0 degrees Celsius, and 1.2 equivalents of NaH are slowly added into a solution including the starting material (1) and the DCM solvent, at 0 degrees Celsius under the Ar gas atmosphere. A reactive material (2) is added into the solution in which NaH are added, at 0 degrees Celsius under the Ar gas atmosphere. The temperature is raised to a room temperature. The solution in which NaH and the reactive material (2) are added is stirred for about 1 hour to manufacture an intermediate-product (3). A "A" portion of the intermediate-product (3) is de-protected to manufacture an end-product (4) having the first functional group. The photosensitive polymer is manufactured by a polymerization using the end-product (4).

Synthesis Example 2 of the Photosensitive Polymer

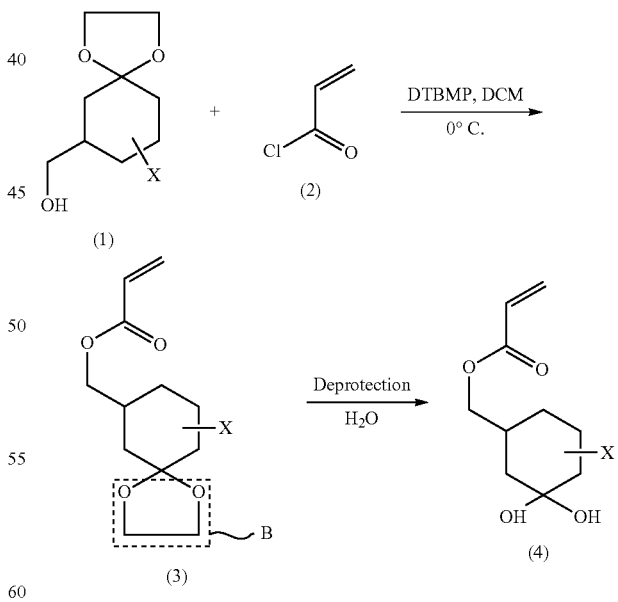

1 equivalents of a starting material (1), 1.2 equivalents of a reactive material (2), and 2 equivalents of DTBMP are dissolved in dry di-chloro-methane (DCM) at 0 degrees Celsius under an Ar gas atmosphere. The temperature is raised to a room temperature. A solution including the starting material (1), the reactive material (2), DTBMP, and the DCM solvent is stirred for about 1 hour to manufacture an intermediate-product (3). A "B" portion of the intermediate-product (3) is de-protected to manufacture an end-product (4) having the first functional group. The photosensitive polymer is manufactured by a polymerization using the end-product (4). Here, X is one of —H, —F, —Cl, —Br, —I, —$NH_2$, —OH, and halide.

FIG. 1 illustrates a flow chart depicting a method for forming a fine pattern, according to embodiments. FIGS. 2 to 7 illustrate conceptual views of stages of a method for forming a fine pattern, according to embodiments.

Figure 2:
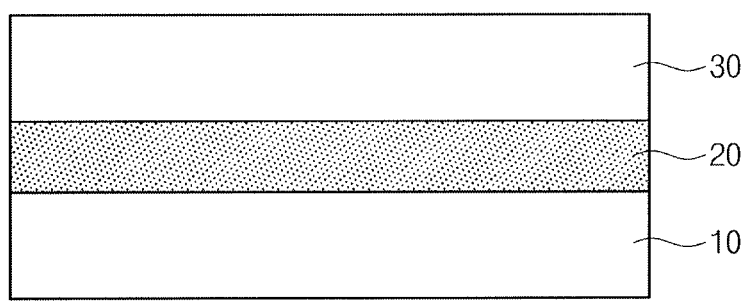
FIGS. 2 to 7 illustrate conceptual views showing stages of a method for forming a fine pattern, according to embodiments.

Referring to FIGS. 1 and 2, an etch target layer 20 may be formed on a substrate 10, and a photoresist layer 30 may be formed on the etch target layer 20 (S10). The substrate 10 may be a semiconductor substrate, and the etch target layer 20 may include a conductive layer and/or an insulating layer. The formation of the photoresist layer 30 may include applying the photoresist composition to the substrate 10. The photoresist composition may be the chemically amplified negative photoresist composition that includes the photosensitive polymer and the photoacid generator (PAG). The photosensitive polymer may include the polymer chain and the at least one first functional group coupled to the polymer chain. In some embodiments, the photosensitive polymer may include the structure represented by Chemical Formula 2 or Chemical Formula 3.

Figure 3:
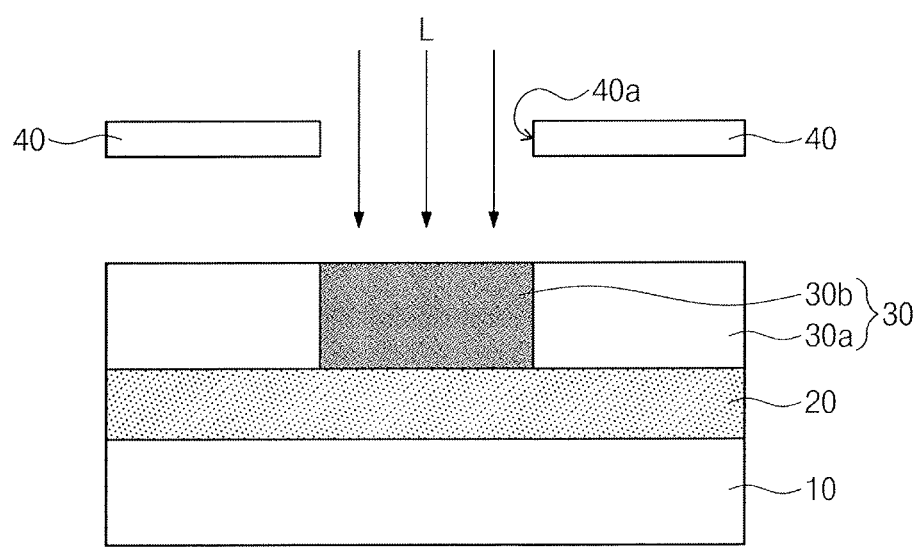

Referring to FIGS. 1 and 3, an exposure process may be performed on the photoresist layer 30 (S20). The exposure process may include providing a photomask 40 over the photoresist layer 30 and irradiating light L onto the photoresist layer 30. The photomask 40 may have an opening 40a, and the light L may be irradiated to the photoresist layer 30 through the opening 40a. By the exposure process, the photoresist layer 30 may include a first portion 30a that is not exposed to the light L and a second portion 30b that is exposed to the light L. In the second portion 30b, the photoresist composition may include the acid ions ($H^+$) generated by the photoacid generator. In the second portion 30b, the first functional group in the photosensitive polymer may be converted into the second functional group by the de-protection reaction in the presence of the acid ion ($H^+$) catalyst, as described with reference to the Reaction Formula 1 or the Reaction Formula 1-1. Thus, the second portion 30b may include a photosensitive polymer modified by exposure to light L. The modified photosensitive polymer may include the polymer chain and at least one second functional group coupled to the polymer chain. In some embodiments, the modified photosensitive polymer may include the structure represented by Chemical Formula 6 or Chemical Formula 7. The first portion 30a may include the photosensitive polymer including the structure represented by Chemical Formula 2 or Chemical Formula 3. The photosensitive polymer may have a hydrophilic property, and the modified photosensitive polymer may have a hydrophobic property. For example, by the exposure process, the photoresist layer 30 may include the first portion 30a having the hydrophilic property and the second portion 30b having the hydrophobic property.

Figure 4:
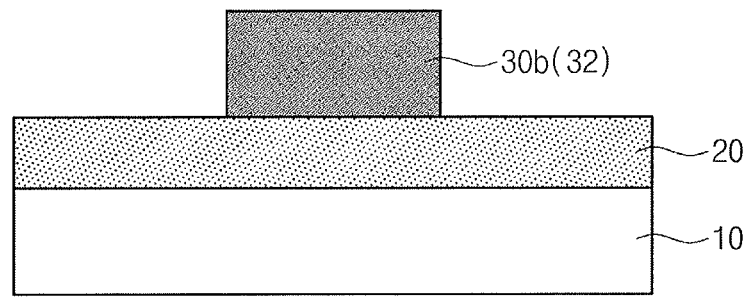
Figure 6:
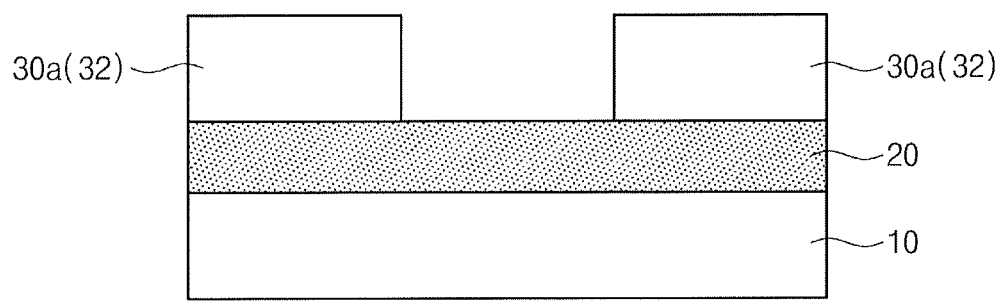

Referring to FIGS. 1, 4, and 6, a development process may be performed on the exposed photoresist layer 30 to form a photoresist pattern 32 (S30). In some embodiments, as illustrated in FIG. 4, the development process may be performed using a positive tone developing (PTD) method. In this case, the first portion 30a having the hydrophilic property may be removed by the development process, and the second portion 30b having the hydrophobic property may remain on the substrate 10 after the development process. For example, the second portion 30b may be defined as the photoresist pattern 32. In some implementations, as illustrated in FIG. 6, the development process may be performed using a negative tone developing (NTD) method. In this case, the second portion 30b having the hydrophobic property may be removed by the development process, and the first portion 30a having the hydrophilic property may remain on the substrate 10 after the development process. For example, the first portion 30a may be defined as the photoresist pattern 32.

Figure 5:
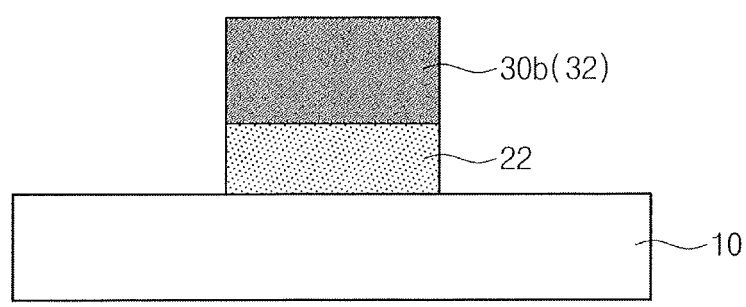
Figure 7:
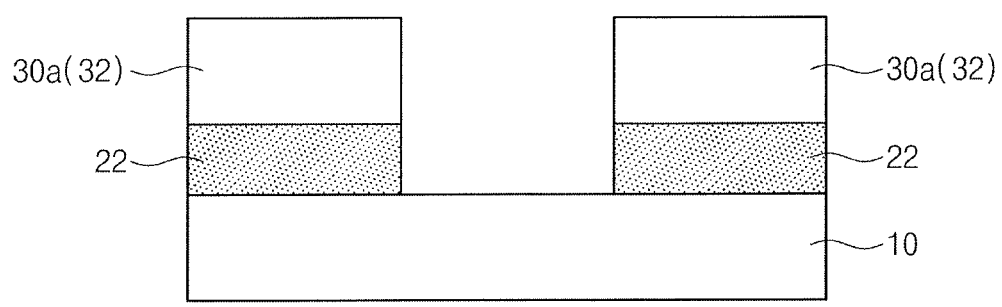

Referring to FIGS. 1, 5, and 7, the etch target layer 20 may be patterned using the photoresist pattern 32 as an etch mask (S40). The patterning of the etch target layer 20 may include performing an etching process using the photoresist pattern 32 as an etch mask. A pattern 22 may be formed on the substrate 10 by patterning the etch target layer 20.

If a photoresist composition of the photoresist layer 30 were to have a low photosensitivity, it could be difficult to change the physical properties of the photoresist layer 30 by performing the exposure process. For example, the second portion 30b exposed to the light L may not be easily modified to have a different polarity and/or solubility from the first portion 30a, which is not exposed to the light L. In this case, at least a portion of the photoresist layer 30 could remain between the photoresist patterns 32 after the exposure and development processes are performed. The portion (e.g., a photoresist scum) of the photoresist layer 30 that remains between the photoresist patterns 32 may cause a defect of a subsequent etching process.

According to embodiments, the photoresist composition of the photoresist layer 30 may include the photosensitive polymer. The photosensitive polymer may include at least one first functional group coupled to the polymer chain. In the second portion 30b of the photoresist layer 30, the first functional group may be converted into a second functional group by the de-protection reaction in the presence of the acid ion ($H^+$) catalyst generated by the exposure, without an additional crosslinking reaction. In this case, since the reaction path of the de-protection reaction is simpler than that of a crosslinking reaction caused by a crosslinking agent, it may be easy to change the physical properties (e.g., polarity and/or solubility) of the second portion 30b by using light L. Thus, photoresist scum or residue that could occur between photoresist pattern 32 may be minimized, and it may be easier to form photoresist patterns 32 having a fine pitch.

By way of summation and review, to provide a highly integrated semiconductor device in which many elements are provided in a small area, and to meet design rules of semiconductor devices that have been significantly reduced, it is desirable that a pitch of patterns, which corresponds to a sum of a width of each pattern and a distance between the patterns, be reduced. However, the formation of patterns having a fine pitch may be difficult due to a resolution limitation of a photolithography process as a photoresist layer becomes thicker and the pitch of the patterns becomes smaller. Thus, photoresist compositions with greater sensitivity to light irradiated to a photoresist layer are desirable.

Embodiments provide a photoresist composition having high photosensitivity. Photoresist patterns may be formed using the photoresist composition, and thus photoresist scum that could be formed between the photoresist patterns may be minimized or prevented. As a result, the photoresist patterns having the fine pitch may be easily formed.

Embodiments further provide a method for forming fine patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A photoresist composition, comprising:
a photosensitive polymer including a polymer chain and at least one first functional group coupled to the polymer chain; and
a photoacid generator,
wherein the photosensitive polymer includes a structure represented by the following Chemical Formula 2 or the following Chemical Formula 3,

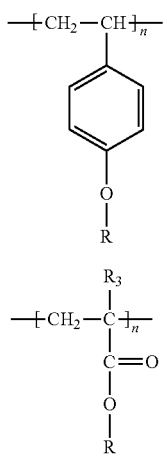

[Chemical Formula 2]

[Chemical Formula 3]

where n is an integral number ranging from 1 to 1,000,000, $R_3$ is one of —H and $CH_3$, and R is represented by the following Chemical Formula 4,

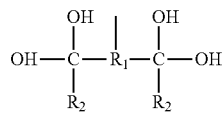

[Chemical Formula 4]

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20.

2. The photoresist composition as claimed in claim 1, wherein;
the photoacid generator generates acid ions ($H^+$) when the photoacid generator is exposed to light, and
the first functional group is converted into a second functional group by a de-protection reaction using the acid ions ($H^+$) as a catalyst, the second functional group having a structure represented by the following Chemical Formula 8,

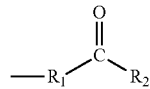

[Chemical Formula 8]

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20.

3. A photoresist composition, comprising:
a photosensitive polymer including a polymer chain and a first functional group coupled to the polymer chain, and a photoacid generator, wherein:
the photoacid generator generates acid ions ($H^+$) when the photoacid generator is exposed to light, and
the first functional group is convertible into a second functional group by a de-protection reaction using the acid ions ($H^+$) as a catalyst, wherein the second functional group has a structure represented by the following Chemical Formula 8,

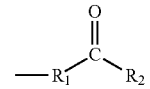

[Chemical Formula 8]

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20, and wherein the polymer is hydrophilic when it contains the first functional group and hydrophobic when the first functional group is converted into the second functional group, and
wherein the photosensitive polymer includes a structure represented by the following Chemical Formula 2 or the following Chemical Formula 3,

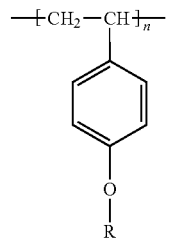

[Chemical Formula 2]

-continued

[Chemical Formula 3]

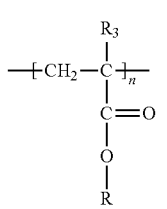

where n is an integral number ranging from 1 to 1,000,000, $R_3$ is one of —H and $CH_3$, and R is represented by the following Chemical Formula 4,

[Chemical Formula 4]

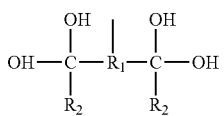

where $R_1$ is one of an alkyl group having a carbon number of 1 to 20 and an aryl group having a carbon number of 1 to 20, and $R_2$ is one of —H, —F, —Cl, —Br, an alkyl group having a carbon number of 1 to 20, and an aryl group having a carbon number of 1 to 20.

4. The photoresist composition as claimed in claim 3, wherein the first functional group has a structure represented by the following Chemical Formula 1,

[Chemical Formula 1]

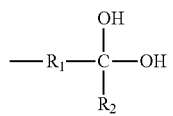

where $R_1$ is one of an alkyl group having a carbon number of 1 to 20 and an aryl group having a carbon number of 1 to 20, and $R_2$ is an alkyl group having a carbon number of 1 to 20 or an aryl group having a carbon number of 1 to 20.

* * * * *